United States Patent
Kim

[19]

[11] Patent Number: 6,114,891
[45] Date of Patent: Sep. 5, 2000

[54] PULSE GENERATING CIRCUIT FOR DYNAMIC RANDOM ACCESS MEMORY DEVICE

[75] Inventor: Dae Jeong Kim, Euiwang, Rep. of Korea

[73] Assignee: LG Semicon Co., Ltd., Choongcheongbuk-Do, Rep. of Korea

[21] Appl. No.: 09/178,895

[22] Filed: Oct. 27, 1998

[30] Foreign Application Priority Data

Apr. 16, 1998 [KR]  Rep. of Korea ............... 98/13618

[51] Int. Cl.[7] ................................................ H03K 17/00
[52] U.S. Cl. ........................ 327/172; 327/99; 327/299
[58] Field of Search ............................ 327/99, 299, 298, 327/294, 293, 291, 172, 175, 176; 713/501

[56] References Cited

U.S. PATENT DOCUMENTS 4,970,405  11/1990  Hariwara .............................. 307/269
5,583,461  12/1996  Lowe .................................... 327/172
5,886,562   3/1999  Garrity et al. ........................ 327/415

*Primary Examiner*—Tuan T. Lam
*Assistant Examiner*—Linh Nguyen
*Attorney, Agent, or Firm*—Morgan, Lewis & Bockius LLP

[57] ABSTRACT

A pulse generating circuit for a dynamic random access memory includes a fixed pulse generating unit receiving an input signal and generating an output pulse signal of a fixed width, a pulse delay unit receiving the input signal and delaying an output pulse signal of a variable width, a pulse width detecting unit receiving the input signal and an inverted input signa, outputting a first flag signal displaying a low pulse width by detecting the low pulse width of the input signal, and outputting a second flag signal displaying a high pulse width by detecting the high pulse width of the input signal, a NOR gate performing a logical operation on the first flag signal and the second flag signal and outputting a third flag signal, and a multiplexer coupled to the fixed pulse generating unit, the pulse delay unit, and the pulse width detecting unit and outputting an output pulse signal in accordance with the third flag signal.

16 Claims, 4 Drawing Sheets

FIG. 1
BACKGROUND ART
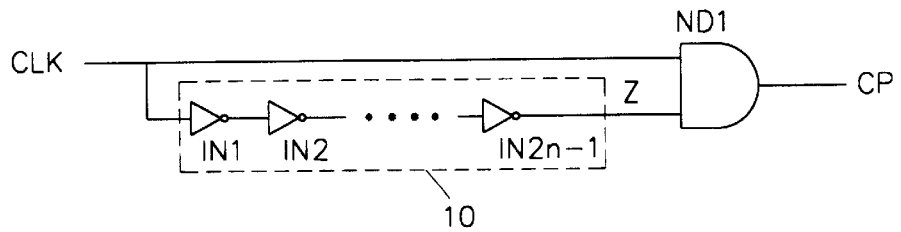
FIG. 2A
BACKGROUND ART
CLK
FIG. 2B
BACKGROUND ART
Z
FIG. 2C
BACKGROUND ART
CP
FIG. 3A
BACKGROUND ART
CLK'
FIG. 3B
BACKGROUND ART
Z'
FIG. 3C
BACKGROUND ART
CP'

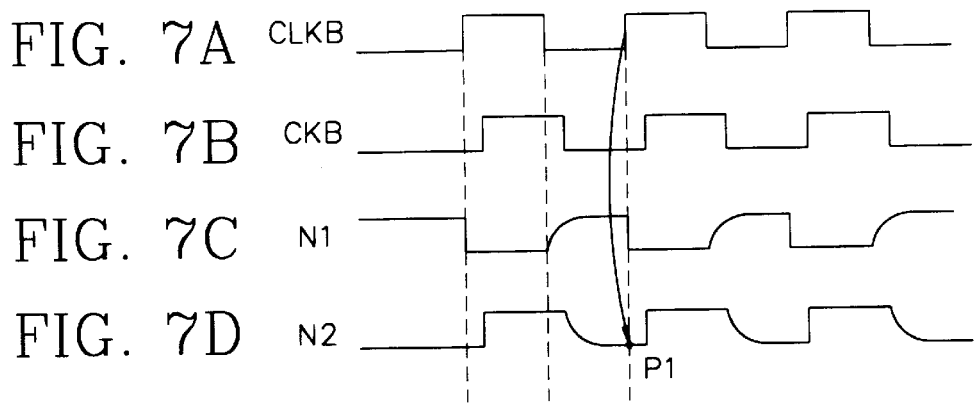
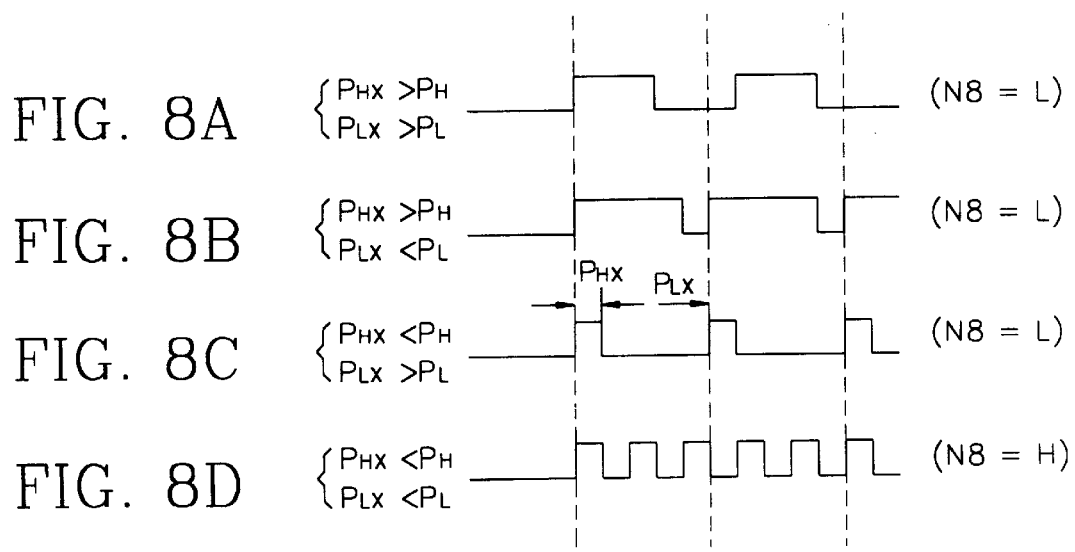

PULSE GENERATING CIRCUIT FOR DYNAMIC RANDOM ACCESS MEMORY DEVICE

This application claims the benefits of Korean Appication No. 98-13618 filed Apr. 16, 1998, which is hereby incorporated by reference.

BACKGROUND OF THE INVENTION

1. Field of the Invention

The present invention relates to a pulse generating circuit, and more particularly, to a pulse generating circuit for a dynamic random access memory (DRAM) device. Although the present invention is suitable for a wide scope of applications, it is particularly suitable for eliminating a malfunction in operating a DRAM, thereby improving a reliability in the DRAM.

2. Description of the Related Art

In general, the range of an operational frequency of DRAM devices is about several tens MHZ. Since the range of the operational frequency becomes higher, it is constantly broadened. Accordingly, a timing skew among signals controlling the DRAM must be eliminated in order to properly operate in the wide range.

A pulse generating circuit for a DRAM and operation of the same according to a background art will be described with reference to the accompanying drawings.

FIG. 1 is a pulse generating circuit for a DRAM according to the background art. As shown in FIG. 1, the pulse generating circuit for the DRAM includes a delay unit 10 delaying an input signal CLK and outputting a delay signal Z. An AND gate ND1 receiving the input signal CLK and the delay signal Z and generating an output pulse signal CP. The delay unit 10 having the odd number of inverters IN1, IN2 ... IN2n−1.

The pulse generating circuit for the DRAM according to the background art outputs a predetermined output pulse signal CP regardless of a frequency of the input signal. The operation process is illustrated in FIGS. 2A to 2C and 3A to 3C.

FIG. 2A is an input signal of a high frequency CLK. As shown in FIG. 2B, the delay unit 10 receiving the input signal CLK outputs the delay signal Z. In FIG. 2C, the AND gate ND1 receiving the input signal CLK and the delay signal z generates an output pulse signal CP having a predetermined pulse width td1. A width of the output pulse signal CP is determined only by the number of inverters IN1, IN2, ... , IN2n−1 of the delay unit 10.

Similarly, FIG. 3A is an input signal of a low frequency CLK'. FIG. 3B illustrates that the delay unit 10 delaying the signal of the low frequency outputs a delay signal Z' delayed for a period the same as the delay time tdl of the input signal of the high frequency CLK. Therefore, the AND gate ND1 receiving the input signal of the low frequency CLK' and the delay signal Z' outputs an output pulse signal CP' identical to the output pulse signal CP generated from the signal of the high frequency CLK. It is because the output pulse signals CP and CP' are determined solely by the number of the inverters IN1, IN2, ... , IN2n−1.

Regardless of a frequency of the input signal, a width of the output pulse signal from the pulse generating circuit is determined solely by the number of the inverters IN1, IN2, ... , IN2n−1 included in the delay unit 10 of the pulse generating circuit. In order to control the DRAM, the output pulse signal is generated by receiving the input signal of the high frequency in the pulse generating circuit. The output pulse signal does not generate a timing skew with the other control signals controlling the DRAM and serves to control the DRAM without a malfunction.

However, as the range of the operational frequency of the DRAM is broadened, the input signal in the pulse generating circuit according to the background art generates the output pulse signal by receiving a low frequency to control the DRAM. Thus, the output pulse signal has a pulse width identical to the output pulse signal generated by receiving a high frequency. Therefore, the output pulse signa generates a timing skew with the other control signals generated by the low frequency signal, thereby breaking down the DRAM.

SUMMARY OF THE INVENTION

Accordingly, the present invention is directed to a pulse generating circuit for dynamic random access memory device that substantially obviates one or more of problems due to limitations and disadvantages of the related art.

An object of the present invention to provide an improved pulse generating circuit for a dynamic random access memory DRAM that broadens an operational range of the DRAM in a low frequency region by generating an output pulse signal having a fixed width when an input signal of a high frequency is inputted thereto, and by generating an output pulse signal having a variable width when an input signal of a low frequency is inputted thereto.

Additional features and advantages of the invention will be see forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a pulse generating circuit for a dynamic random access memory includes a fixed pulse generating unit receiving an input signal and generating an output pulse signal of a fixed width, a pulse delay unit receiving the input signal and delaying an output pulse signal of a variable width, a pulse width detecting unit receiving the input signal and an inverted input signal, outputting a first flag signal displaying a low pulse width by detecting the low pulse width of the input signal, and outputting a second flag signal displaying a high pulse width by detecting the high pulse width of the input signal, a NOR gate performing a logical operation on the first flag signal and the second flag signal and outputting a third flag signal, and a multiplexer coupled to the fixed pulse generating unit, the pulse delay unit, and the pulse width detecting unit and outputting an output pulse signal in accordance with the third flag signal.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIG. 1 is a circuit diagram of a pulse generating circuit according to a background art;

FIGS. 2A to 2C are timing diagrams illustrating an output pulse signal generated in the background art pulse generating circuit when a high frequency signal is inputted;

FIGS. 3A to 3C are timing diagrams illustrating an output pulse signal generated in the background art pulse generating circuit when a low frequency signal is inputted;

FIGS. 7A to 7D are timing diagrams illustrating the process of detecting a width of an input signal by the pulse width detecting unit in the pulse generating circuit of FIG. 5 in accordance with the present invention; and FIGS. 8A to 8D are timing diagrams illustrating a third flag signal pursuant to the pulse width of FIGS. 7A to 7D in accordance with the present invention.

DETAILED DESCRIPTION OF THE INVENTION

Reference will now be made in detail to the preferred embodiments of the present invention, examples of which are illustrated in the accompanying drawings.

Throughout the application, "low pulse width" indicates a narrow pulse width and "high pulse width" indicates a wide pulse width.

Figure 4:
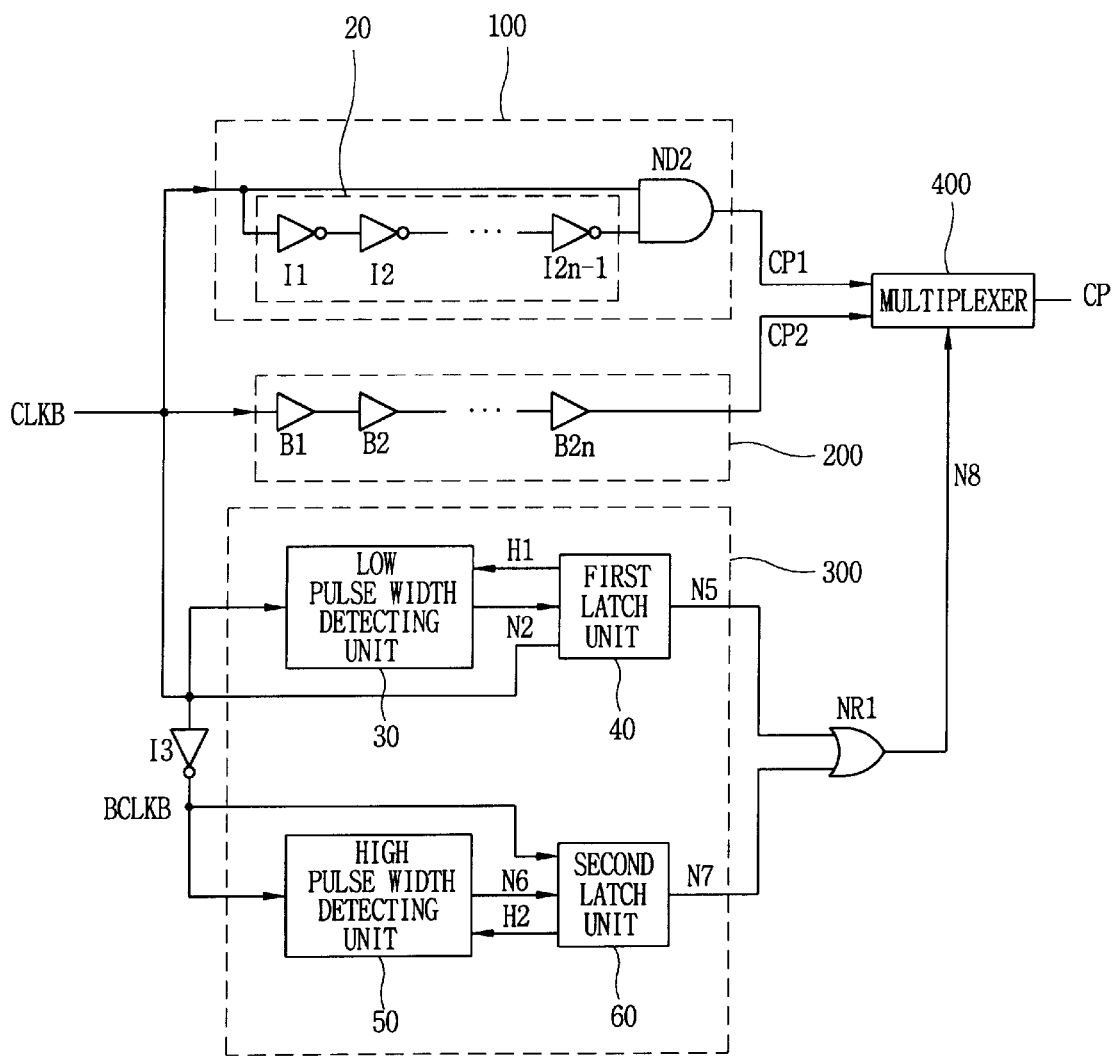
FIG. 4 is a circuit diagram illustrating a pulse generating circuit in accordance with the present invention.

As illustrated in FIG. 4, the pulse generating circuit for the DRAM in accordance with the present invention includes a fixed pulse generating unit 100 generating a pulse signal of a fixed width CP1. A pulse delay unit 200 generates a pulse signal of a variable width CP2. An inverter I3 inverting an input signal CLKB. A pulse width detecting unit 300 receives the input signal CLKB and the inverted input signal BCLKB, and outputs a first flag signal N5 and a second flag signal N7. A NOR gate NR1 executes a logic product on the first flag signal N5 and the second flag signal N7 and outputting a third flag signal N8. A multiplexer 400 selects the fixed pulse generating unit 100 or the pulse delay unit 200 pursuant to the third flag signal N8 and outputs an output pulse signal CP.

Specifically, each unit will now be explained in detail as follows.

The fixed pulse generating unit 100 includes a delay unit 20 having the odd number of inverters I1, I2, . . . , I2n−1 and an AND gate ND2 performing a logic product on the input signal CLKB and an output signal of the delay unit 20, which is similar to the background art pulse generating unit of FIG. 1.

The pulse delay unit 200 includes a plurality of buffers B1, B2, . . . , B2N delaying the input signal CLKB.

The pulse width detecting unit 300 includes a low pulse width detecting unit 30 receiving the input signal CLKB and a first latch signal H1, and outputting a second low pulse width signal N2. A first latch unit 40 receives the input signal CLKB and the second low pulse width signal N2, and outputs the first latch signal H1 and a first flag signal N5. Similar to the low pulse width detecting unit 30, a high pulse width detecting unit 50 receives the inverted input signal BCLKB and the second latch signal H2, and outputs the second high pulse width signal N6. A second latch unit 60 receives the inverted input signal BCLKB and the second high pulse width signal N6 and outputs the second flag signal N7.

Figure 5:
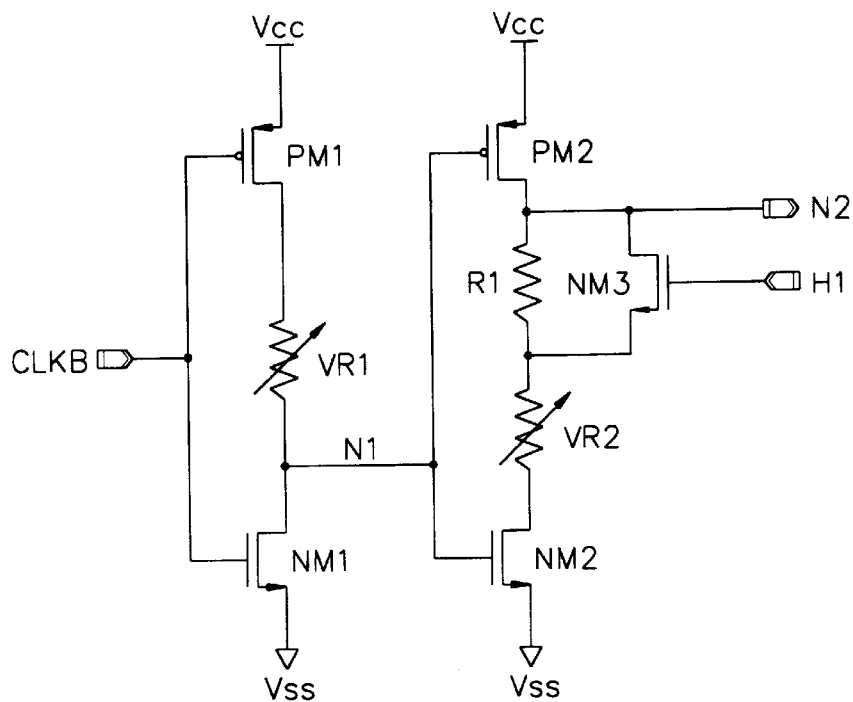
FIG. 5 is a detailed circuit diagram illustrating a low pulse width detecting unit in the pulse generating circuit of FIG. 4 in accordance with the present invention.

FIG. 5 is a detailed circuit diagram of the low pulse width detecting unit 30 in the pulse generating circuit in accordance with the present invention. Specifically, the low pulse width detecting unit 30 includes a first PMOS transistor PM1 and a first NMOS transistor receiving the input signal CLKB through respective gate. A first variable resistor VR1 connects the first PMOS transistor PM1 to the first NMOS transistor NM1, and having an adjustable value of resistance. A second PMOS transistor PM2 and a second NMOS transistor NM2 receive a first low pulse width signal N1 outputted from a node between the first NMOS transistor NM1 and the first variable resistor VR1. A resistor R1 and a second variable resistor VR2 serially connected between the second PMOS transistor PM2 and the second NMOS transistor NM2. A third NMOS transistor NM3 connected in parallel with the resistor R1, and receiving the first latch signal H1.

Figure 6:
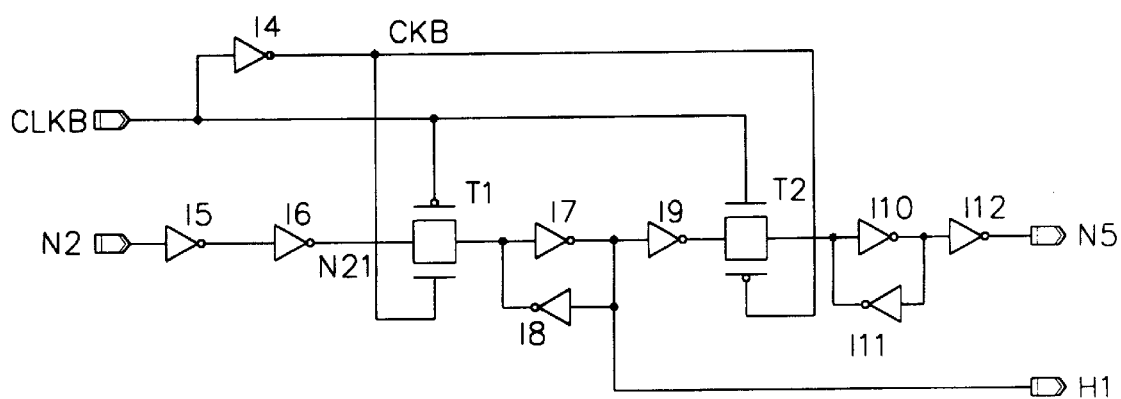
FIG. 6 is a detailed circuit diagram illustrating a first latch unit in the pulse generating circuit of FIG. 4 in accordance with the present invention.

FIG. 6 is a detailed circuit diagram of the first latch unit of the pulse generating circuit in accordance with the present invention. The first latch unit 40 includes an inverter I4 inverting the input signal CLKB. Inverters I5 and I6 delay the second low pulse width signal N2. A first transmission gate T1 transmits the second low pulse width signal N2 delayed by the input signal CLKB and an inverted input signal CKB. Inverters I7 and I8 latches an output signal of the first transmission gate T1, and outputs the first latch signal H1. An inverter I9 inverts the first latch signal H1 and a second transmission gate T2 transmits an output signal of the inverter I9 by the input signal CLKB and the inverted input signal CKB. Inverters I10 and I11 latches an output signal of the second transmission gate T2, and outputs a latch signal. An inverter I12 inverts the latch signal, and outputs the first flag signal N5.

The operation of the pulse generating circuit for the DRAM in accordance with the present invention will be explained more fully by illustrating processes of detecting a pulse width and generating the third flag signal, which is a control signal of the multiplexer, with reference to the accompanying drawings.

FIGS. 7A to 7D is timing diagrams illustrating a signal inputted to and outputted from the low pulse width detecting unit 30. Initially referring to FIG. 7A, when the input signal CLKB is inputted, the first low pulse width signal N1 is at a low level for a rising period of the input signal CLKB as shown in FIG. 7C. The first NMOS transistor NM1 is rapidly turned on, and steadily becomes a high level for a falling period of the input signal CLKB because the first low pulse width signal N1 is passed through the first variable resistor VR1. In addition, the second PMOS transistor PM2 receiving the first low pulse width signal N1 is rapidly turned on for a falling period of the first low pulse width signal N1. Thus, the second low pulse width signal N2 outputted from a node between the second PMOS transistor PM2 and the resistor R1 rapidly becomes a high level, as illustrated in FIG. 7D. However, the second NMOS transistor NM2 receiving the first low pulse width signal N1 is influenced by the resistor R1 and the second variable resistor VR2, and thus the second NMOS transistor NM2 is steadily transited to a low level for a slow rising period of the first low pulse width signal N1. At this time, the third NMOS transistor NM3 connected in parallel with the resistor R1 is operated when the first latch signal H1 is at a high level, and thus the second low pulse width signal N2 is in condition identical to a signal outputted from a node between the second variable resistor VR2 and the second PMOS transistor PM2. Also, the first latch signal H1 has a hysteresis function to prevent the second low pulse width signal N2 from being diffused by an external noise when the second low pulse width signal N2 is latched to a high level.

Here, the first variable resistor VR1 and the second variable resistor VR2 serve to adjust or set a pulse width of the input signal CLKB having a predetermined width. Thus, a level of the input signal detected by the pulse width detecting unit can be varied pursuant to a resistance value of the first variable resistor VR1 and second variable resistor VR2. Therefore, a transition time of the pulse width signal is long when a resistance is large. Conversely, when the resistance is small, the transition time of the pulse width signal is short.

As illustrated in FIG. 7D, when the respective resistances of the first variable resistor VR1 and the second variable resistor VR2 are small, the transition time of the first low pulse width signal N1 is short. The low level of the input signal CLKB having a high frequency can be thus sufficiently lowered. Accordingly, the low pulse width detecting unit 30 precisely detects the low level (point P1 shown in FIG. 7D) of the second low pulse width N2 for a rising period of the input signal CLKB.

However, when the respective resistances of the first variable resistor VR1 and the second variable resistor VR2 are large, the transition time of the first low pulse width signal N1 is long. Therefore, a low level of the input signal CLKB having a high frequency is sufficiently lowered but returns to a high level. Accordingly, the low pulse width detecting unit 30 cannot exactly detect the low level (point P1 in FIG. 7D) for the rising period of the input signal CLKB.

The high pulse width detecting unit 50 is similar to that of the low pulse width detecting unit 30. Instead of the input signal CLKB inputted to the low pulse width detecting unit 30, the inverted input signal BCLKB is inputted to the high pulse width detecting unit 50. However, the same operational principle of the low pulse width detecting unit 30 is utilized in the high pulse width detecting unit 50. However, there is a difference in that the high pulse width detecting unit 50 detects the high level of the input signal CLKB unlike the low pulse width detecting unit 30.

Therefore, after the second low pulse width signal N2 is delayed by the inverters I5 and I6, the delayed second low pulse width signal N2 is transmitted through the first transmission gate T1 in accordance with the input signal CLKB and the inverted input signal CKB. Also, the transmitted second low pulse width signal N2 is outputted as the first latch signal H1 by the inverters I7 and I8. Then, the first latch signal H1 is inputted to the inverter I9 and the third NMOS transistor NM3 of the low pulse width detecting unit 30.

In addition, the first latch signal H1 inverted by the inverter I9 is transmitted through the second transmission gate T2 pursuant to the input signal CLKB and the inverted input signal CKB. After an output signal of the second transmission gate T2 is latched by the inverters I10 and I11, the latched signal is passed through the inverter I12 and outputted as the first flag signal N5.

Similar to the first flag signal N5, the second flag signal N7 is generated by the high pulse width detecting unit 50 and the second latch unit 60.

After passing through the NOR gate NR1, the first flag signal N5 and the second flag signal N7 are outputted as a third flag signal N8. A process of generating the third flag signal N8 will now be explained with reference to FIGS. 8A to 8D.

As described above, a pulse width of the input signal CLKB is determined by the variable resistors VR1 and VR2. Assuming that a low pulse width and a high pulse width are respectively $P_L$ and $P_H$, a low pulse width and a high pulse width to be detected in a predetermined input signal CLKB are $P_{LX}$ and $P_{HX}$, respectively. $P_{LX}$ and $P_{HX}$ are respectively compared to $P_L$ and $P_H$ in the low pulse width detecting unit and the high pulse width detecting unit, thereby generating the first flag signal N5 and the second flag signal N7. A logic operation is performed on the first flag signal N5 and the second flag signals N7 in the NOR gate NR1, and thus the third flag signal N8 is generated. Only when the low pulse width $P_{LX}$ and the high pulse width $P_{HX}$ to be detected are respectively smaller than the predetermined low pulse width $P_L$ and the high pulse width $P_H$ (shown in FIG. 8D), the third flag signal N8 of the high level H is outputted. Otherwise, the third flag signal N8 of the low level L is outputted as shown in FIGS. 8A to 8C.

In this process, the generated third flag signal N8 is at a high level, whereas the input signal CLKB has a low level frequency. Therefore, by selecting the pulse delay unit 200, the output pulse signal of the low frequency CP is outputted. On the other hand, when the input signal CLKB is at a low level, the input signal CLKB has a high frequency. Accordingly, the fixed pulse generating unit 100 is selected and an output signal having a fixed width is outputted. Consequently, the pulse generating circuit for the DRAM in accordance with the present invention is capable of detecting a pulse width of the input signal CLKB pursuant to a frequency of the input signal CLKB and changing a width of the output pulse signal pursuant to the frequency.

The pulse generating circuit in accordance with the present invention generates the output pulse signal having a fixed width when the input signal of the high frequency is inputted thereto, whereas it generates the output signal of the variable width when the input signal of the low frequency is inputted thereto. Therefore, an operational range of the DRAM is broadened, and furthermore a timing skew with the other control signals is prevented, thereby increasing a reliability in operating the DRAM.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A pulse generating circuit for a dynamic random access memory, comprising:

a fixed pulse generating unit receiving an input signal and generating an output pulse signal of a fixed width, wherein the fixed pulse generating unit comprises a delay unit receiving the input signal and generating a delayed input signal, and an AND gate for performing a logic operation on the input signal and the delayed input signal;

a pulse delay unit receiving the input signal and generating a delayed output pulse signal;

a pulse width detecting unit receiving the input signal and an inverted input signal, outputting a first flag signal indicating a low pulse width by detecting the low pulse width of an input signal, and outputting a second flag signal indicating a high pulse width by detecting the high pulse width of an input signal;

a NOR gate performing a logical operation on the first flag signal and the second flag signal and outputting a third flag signal; and a multiplexer coupled to the fixed pulse generating unit, the pulse delay unit, and the pulse width detecting unit and outputting an output pulse signal in accordance with the third flag signal.

2. The pulse generating circuit according to claim 1, further comprising a first inverter inverting the input signal.

3. The pulse generating circuit according to claim 1, wherein the delay unit comprises an odd number of inverters serially connected to one another.

4. The pulse generating circuit according to claim 1, wherein the pulse delay unit comprises a plurality of buffers serially connected to one another.

5. The pulse generating circuit according to claim 1, wherein the pulse width detecting unit comprises:
  a low pulse width detecting unit receiving the input signal, detecting a low pulse width in the input signal, and outputting a first low pulse width signal;
  a first latch unit receiving the input signal and the first low pulse width signal and outputting a first latch signal to the low pulse width detecting unit and the first flag signal;
  a high pulse width detecting unit receiving an inverted input signal and outputting a second high pulse width signal; to detect a high pulse width of the inverted input signal and display a status thereof; and
  a second latch unit receiving the inverted input signal and the second high pulse width signal and outputting a second latch signal to the high pulse width detecting unit and the flag signal.

6. The pulse generating circuit according to claim 5, wherein the first latch unit outputs the first latch signal to provide a hysteresis function in the low pulse width detecting unit.

7. The pulse generating circuit according to claim 5, wherein the second latch unit outputs the second latch signal to provide a hysteresis function in the high pulse width detecting unit.

8. The pulse generating circuit according to claim 5, wherein the low pulse width detecting unit comprises:
  a first PMOS transistor and a first NMOS transistor respectively receiving the input signal;
  a first variable resistor connecting the first PMOS transistor and the first NMOS transistor;
  a second PMOS transistor and a second NMOS transistor respectively receiving the first low pulse width signal outputted between the first variable resistor and the first NMOS transistor;
  a resistor and a second variable resistor serially connecting the second PMOS transistor and the second NMOS transistor; and
  a third NMOS transistor connected in parallel with the resistor.

9. The pulse generating circuit according to claim 5, wherein the low pulse width detecting unit controls a transition time of the input signal by the first variable resistor and the second variable resistor, thereby detecting the low pulse width of the input signal and outputs the first low pulse signal.

10. The pulse generating circuit according to claim 5, wherein the first latch unit comprises:
  a first plurality of inverters delaying the second low pulse width signal;
  a second inverter inverting the input signal and outputting the inverted input signal;
  a first transmission gate transmitting the delayed second low pulse width signal in accordance with the input signal and the inverted input signal;
  a third plurality of inverters latching an output signal of the first transmission gate and outputting the first latch signal to the low pulse width detecting unit;
  a fourth inverter inverting the first latch signal;
  a second transmission gate transmitting the inverted first latch signal in accordance with the input signal and the inverted input signal by the second inverter;
  a fifth plurality of inverters latching an output signal of the second transmission gate; and
  a sixth inverter inverting the latched signal by the fifth plurality of inverters and outputting the first flag signal.

11. The pulse generating circuit according to claim 10, wherein the plurality of inverters are serially connected to one another.

12. The pulse generating circuit according to claim 1, wherein the first flag signal and the second flag signal are determined by respectively comparing a low pulse width and a high pulse width of the input signal to a predetermined low pulse width and a predetermined high pulse width.

13. The pulse generating circuit according to claim 12, wherein the predetermined low pulse width and the predetermined high pulse width are determined by the respective variable resistor in the low pulse width detecting unit and the high pulse width detecting unit.

14. The pulse generating circuit according to claim 1, wherein the multiplexer selects the pulse delay unit when the third flag signal is at a high level, and otherwise selects the fixed pulse generating unit.

15. The pulse generating circuit according to claim 6, wherein the hysteresis function is initiated when the low pulse width detecting unit receives the first latch signal to prevent the second low pulse width signal in the low pulse width detecting unit from being diffused due to an external noise.

16. The pulse generating circuit according to claim 7, wherein the hysteresis function is initiated when the high pulse width detecting unit receives the second latch signal in order to prevent the second high pulse width signal in the high pulse width detecting unit from being diffused due to an external noise.

* * * * *